United States Patent [19]
Tang et al.

[11] Patent Number: 4,690,730
[45] Date of Patent: Sep. 1, 1987

[54] OXIDE-CAPPED TITANIUM SILICIDE FORMATION

[75] Inventors: Thomas E. Tang, Dallas; Che-Chia Wei, Plano; Roger A. Haken, Richardson; Thomas C. Holloway; David A. Bell, both of Dallas, all of Tex.

[73] Assignee: Texas Instruments Incorporated, Dallas, Tex.

[21] Appl. No.: 876,947

[22] Filed: Jun. 20, 1986

Related U.S. Application Data

[63] Continuation-in-part of Ser. No. 837,468, Mar. 7, 1986, which is a continuation-in-part of Ser. No. 729,318, May 1, 1985.

[51] Int. Cl.⁴ .................. H01L 21/306; B44C 1/22; C03C 15/00; C23F 1/02

[52] U.S. Cl. .................. 156/643; 156/646; 156/653; 156/656; 156/657; 156/662; 437/237; 437/41; 437/200

[58] Field of Search .............. 156/643, 644, 646, 650, 156/651, 652, 653–655, 656, 657, 659.1, 662; 148/1.5, 187, 191; 29/571, 577 C, 591, 578; 357/23.1, 41, 42, 49, 67; 427/88–91, 38, 39

[56] References Cited

U.S. PATENT DOCUMENTS 4,593,454 6/1986 Baudrant et al. ............... 29/571
4,617,723 10/1986 Mukai .......................... 29/571 X
4,635,347 1/1987 Lien et al. ..................... 29/578 X

*Primary Examiner*—William A. Powell
*Attorney, Agent, or Firm*—Douglas A. Sorensen; Leo N. Heiting; Melvin Sharp

[57] ABSTRACT

A cap oxide (or oxide/nitride) prevents silicon outdiffusion during the reaction step which forms direct-react titanium silicide.

55 Claims, 14 Drawing Figures

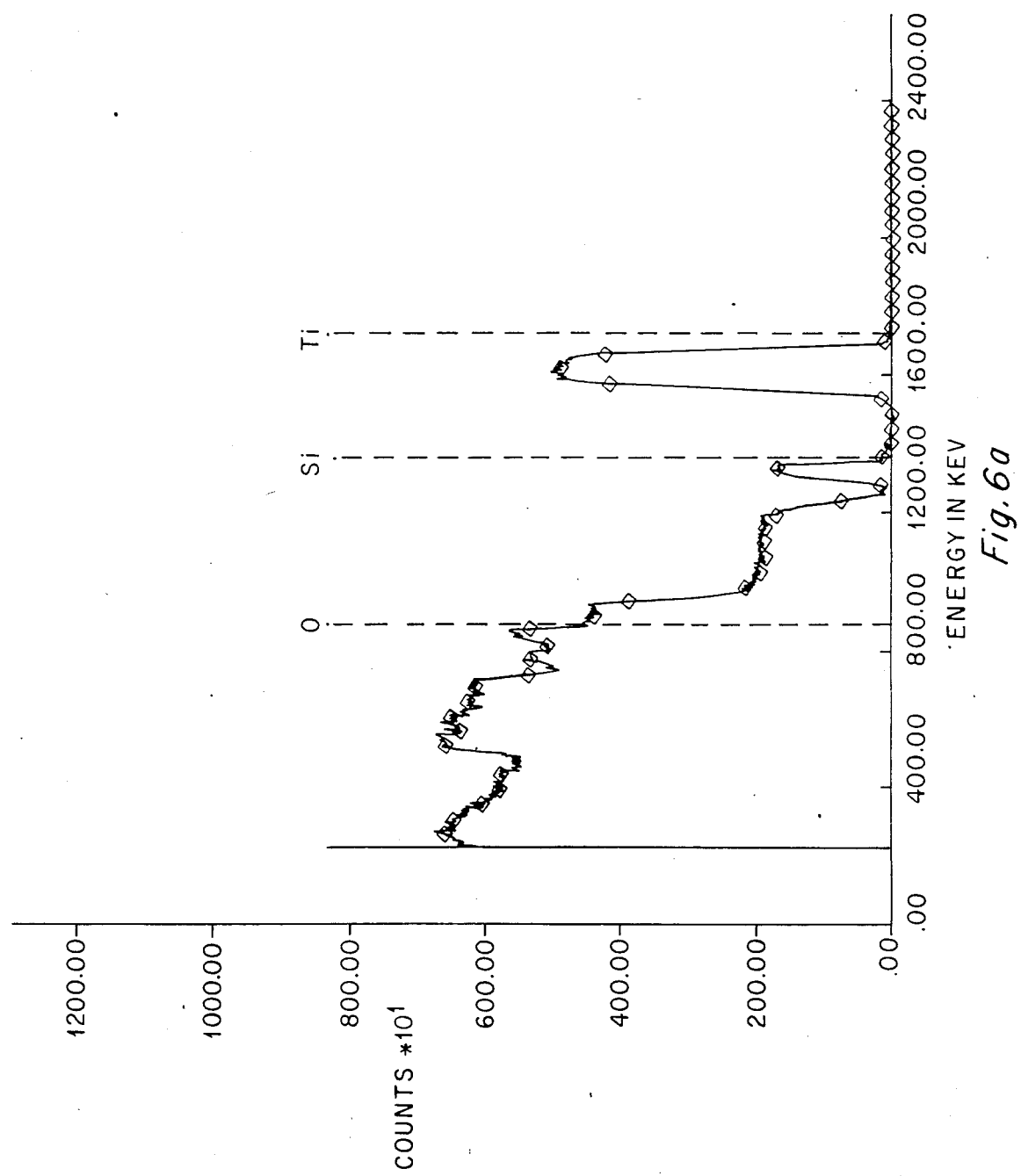

4,690,730

OXIDE-CAPPED TITANIUM SILICIDE FORMATION

CROSS-REFERENCE TO RELATED APPLICATIONS

The present invention is a continuation-in-part of Ser. No. 837,468, filed 03/07/86, pending, which itself is a continuation-in-part of Ser. No. 729,318, filed 05/01/85, pending.

BACKGROUND AND SUMMARY OF THE INVENTION

The present invention relates to integrated circuits and to methods for manufacturing them.

Self-aligned refractory metal-silicide technology has been recognized as one of the keys to realizing good device performance in integrated circuits as device dimension scales down. Titanium disilicide ($TiSi_2$) has become recognized as one of the most attractive metal-silicides, because of its low resistivity, stability, and capability for self-aligned formation.

One of the major advantages of titanium silicide technology is the availability of a self-aligned VLSI process. That is, by depositing a layer of titanium metal overall and then heating in a nitrogen atmosphere, all exposed areas of silicon (whether monocrystalline or polycrystalline) will react to form titanium silicides, and a composition dominated by titanium nitrides will be formed where the titanium metal was not in contact with silicon. This is tremendously useful, since, by performing this step after the polysilicon gate level has been patterned, silicide will be formed on the surface of exposed source/drain regions (or other exposed substrate surface regions), on the surface of the polysilicon gate level, and nowhere else. This means that the source/drain diffusions can be made shallower while still preserving an acceptably low sheet resistance, and also means that the sheet resistance of the polysilicon gate level can be lowered. The use of the nitrogen atmosphere in this process is critical, since otherwise silicon will outdiffuse through the growing silicide layer and permit lateral growth, so that the titanium silicide formed by this reaction will be able to bridge gaps of a half micron or so, e.g. between gate and source/drain of a VLSI device. Such a process is described in, for example, M. Alperin et al., *Development of the Self-aligned $TiSi_2$ Process for VLSI Applications*, at page 141 of the February 1985 issue of the IEEE Transactions on Electron Devices, which is hereby incorporated by reference.

However, this self-aligned $TiSi_2$ technology is degraded by any oxygen contamination of the nitrogen atmosphere used for the silicide react process. It has been found that oxygen contamination during the react process can result in two problems: first, the silicide would have high resistivity; second, the unreacted titanium (or non-silicide material such as titanium nitride) was hard to strip off.

In general, titanium dioxide has some chemical properties which are quite inconvenient in integrated circuit fabrication. $TiO_2$ has an extremely high heat of formation, and is accordingly an extremely stable compound. Etching of $TiO_2$ is very difficult, and any oxygen present during the nitridation step is very likely to form $TiO_2$, which is more energetically favorable than TiN. Since $TiO_2$ is an insulator, unlike TiN or $TiSi_2$, $TiO_2$ formation can cause drastic degradation in electrical properties, and is not easily reversed.

In order to avoid possible oxygen contamination, the manufacturing process will normally either use a very high flow rate of high purity purging gas such as argon (along with the high purity $N_2$ supply) or use low pressure in the react environment. Both of these methods increase the production cost and, in practice, are hard to maintain. The use of Rapid Thermal Processing to form $TiSi_2$ does alleviate some of the contamination concerns, but gas flow rates and purity still play an important role in achieving uniform silicidation.

The present invention minimizes the problems of oxygen contamination by placing a cap oxide on top of the titanium layer before the silicide react. During the react process, this oxide is partially reduced by the adjacent layer of titanium metal. Therefore, some oxygen will be freed and can diffuse into the titanium layer. In the low temperature stage of the react process, the oxygen is gettered at the grain boundaries of the titanium metal and will retard the silicon atom from outdiffusion across grain boundaries. The introduced oxygen impurity in this process apparently performs a function partially analogous to that of the nitrogen used in the traditional self-aligned $TiSi_2$ process.

The reasons why oxygen derived from the oxide layer does not lead to the same problems as free oxygen contamination would (difficulty in stripping, and poor sheet resistance of the silicide) are not perfectly understood. However, it is suspected that the activation energy of forming $TiO_2$ may play an important role. The redox reaction which forms titanium dioxide and silicon from titanium and silicon dioxide will have a much smaller enthalpy than the reaction of titanium with gaseous oxygen, and the activation energy of the redox reaction may also be higher. Moreover, the composition of the titanium dioxides is likely to be different; titanium reacting with free $O_2$ will typically form rutile (an extremely stable form of $TiO_2$), whereas oxygen diffusing along the grain boundaries of the titanium metal may form a much more weakly bound compound.

It should also be noted that titanium metal has an extremely high affinity for hydrogen, so it is possible that hydrogen already present at the grain boundaries of the titanium may cooperate in some fashion with the oxygen diffusing down from the cap oxide to limit silicon diffusion.

In any case, it has been experimentally demonstrated that the titanium/oxygen composite under the cap oxide will block silicon outdiffusion during the siliciding step, can be converted to a composition predominantly comprising titanium nitride during a nitrogen atmosphere anneal, and can be converted to titanium silicide if heated while in contact with silicon. Thus it seems clear that the oxygen in this location is in some form which is less stable than rutile $TiO_2$.

An alternative embodiment of the present invention teaches that the titanium layer should be capped with an oxide/nitride stack, to provide further protection against oxygen indiffusing through the cap oxide.

A key advantage of the titanium silicide process is that local interconnects are readily available. That is, as described in grandparent application Ser. No. 729,318, filed 05/01/85, pending. During the nitrogen-atmosphere directreact process the portions of the titanium which are not in contact with silicon will form a composition which principally comprises titanium nitride (TiN), although this composition will typically not be perfectly stoichiometric. If local interconnects are not needed this TiN layer can simply be stripped: but if desired the TiN layer can be patterned and etched to provide very thin low-sheet-resistance local interconnects.

The parent application (Ser. No. 837,468, filed 03/07/86, pending) described, among other embodiments, one embodiment in which the TiN layer was patterned by patterning a cap oxide over the as-deposited titanium layer. The structure with the patterned cap oxide in place was then heated in nitrogen to form silicides, all exposed TiN was stripped, and then the cap oxide was stripped and the remaining titanium (which had been protected by the cap oxide) was again heated in nitrogen to form TiN local interconnects. That application described the surprising chemical interactions between the cap oxide and the titanium which permitted this process to work, and described the composition of the resulting local interconnects. The present invention is generally compatible with this process, except that the cap oxide layer (which defines the local interconnect pattern) is patterned and etched *after* the silicidation reaction rather than before it.

Another feature of the nitrogen atmosphere process is that competing reactions are occurring over silicon: titanium nitride grows downward from the gas phase as titanium silicide grows up from the silicon interface. Since these competing reactions have unequal activation energies, the $TiN/TiSi_2$ thickness ratio is a sensitive function of temperature. Since the TiN will be removed except at local interconnect locations, Ti consumed by TiN formation lowers the sheet resistance of the silicide layer. This means that sheet resistance is a sensitive function of reaction temperature, which is undesirable.

Thus, the present invention provides at least the following advantages, in addition to others mentioned in this application:

1. Since the process requires no interaction between the titanium and ambient gas such as nitrogen, it can easily be made immune to oxygen contamination by making the cap material a nitride/oxide stack. Therefore, no special requirements need be imposed on the react ambient. This greatly reduces processing cost and improves the reproducibility of film quality.

2. Since there is no titanium nitride formed during the react, the sheet resistance of the $TiSi_2$ layer is less dependent on the react temperature than in the nitrogen atmosphere process.

3. The capability for titanium nitride local interconnect is not affected by this method. Titanium nitride interconnects can easily be fabricated, by selectively etching away the unreacted titanium and then performing another thermal nitridation in a noncritical nitrogen ambient.

4. The final anneal of the $TiSi_2$ could be performed in nitrogen ambient to produce a stacked titanium nitride/$TiSi_2$ layer, where the titanium nitride could be used as a good aluminum diffusion barrier. This method will produce thicker titanium nitride than the nitrogen-atmosphere process without sacrificing the sheet resistance of the $TiSi_2$, since no titanium material on the silicide layer is stripped away before the anneal.

According to the present invention there is provided: A method for fabricating integrated circuit devices, comprising the steps of: providing a substrate having thereon a partially fabricated integrated circuit structure including exposed portions consisting essentially of silicon; depositing overall a metal layer consisting predominantly of titanium; providing a dielectric layer directly overlying at least predetermined portions of said metal layer, said dielectric layer consisting predominantly of oxides; and applying heat until portions of said metal layer react with portions of said exposed silicon to form titanium silicides; whereby said dielctric layer suppresses silicon outdiffusion through portions of said metal layer under said dielectric layer.

According to the present invention there is also provided: A method for fabricating integrated circuit devices, comprising the steps of: providing a substrate having thereon a partially fabricated integrated circuit structure including exposed portions consisting essentially of silicon; depositing overall a metal layer consisting predominantly of titanium; providing a dielectric layer directly overlying at least predetermined portions of said metal layer, said dielectric layer consisting predominantly of oxides; and applying heat until portions of said metal layer react with portions of said exposed silicon to form titanium silicides; whereby said dielectric layer suppresses silicon outdiffusion through portions of said metal layer under said dielectric layer; removing predetermined portions of said dielectric layer and/or of the remainder of said metal layer in a predetermined pattern to define local interconnects; and applying heat in a nitrogen atmosphere to convert remaining portions of metal layer to a conductive material consisting predominantly of titanium nitride.

According to the present invention there is also provided: A method for fabricating integrated circuit devices, comprising the steps of: providing a substrate having thereon a partially fabricated integrated circuit structure including exposed portions consisting essentially of silicon; depositing overall a metal layer consisting predominantly of titanium; providing a dielectric layer directly overlying at least predetermined portions of said metal layer, said dielectric layer consisting predominantly of oxides; and applying heat until portions of said metal layer react with portions of said exposed silicon to form titanium silicides, whereby said dielectric layer suppresses silicon outdiffusion through portions of said metal layer under said dielectric layer; removing said dielectric layer; applying heat in a nitrogen atmosphere to convert remaining portions of metal layer to a conductive material consisting predominantly of titanium nitride; and etching said conductive material in a predetermined pattern to provide local interconnect lines.

BRIEF DESCRIPTION OF THE DRAWINGS

The present invention will be described with reference to the accompanying drawings, wherein:

FIG. 6A shows the raw data of counts versus secondary ion energy derived from a Rutherford Backscattering analysis (RBS analysis) of a structure having 1000 A over 1500 A of Ti over 5000 A of $SiO_2$. The dashed lines shown for oxygen, silicon and titanium show the energy peaks which would be expected if these elements were present only at the surface of the sample.

DESCRIPTION OF THE PREFERRED EMBODIMENTS

Figure 1:
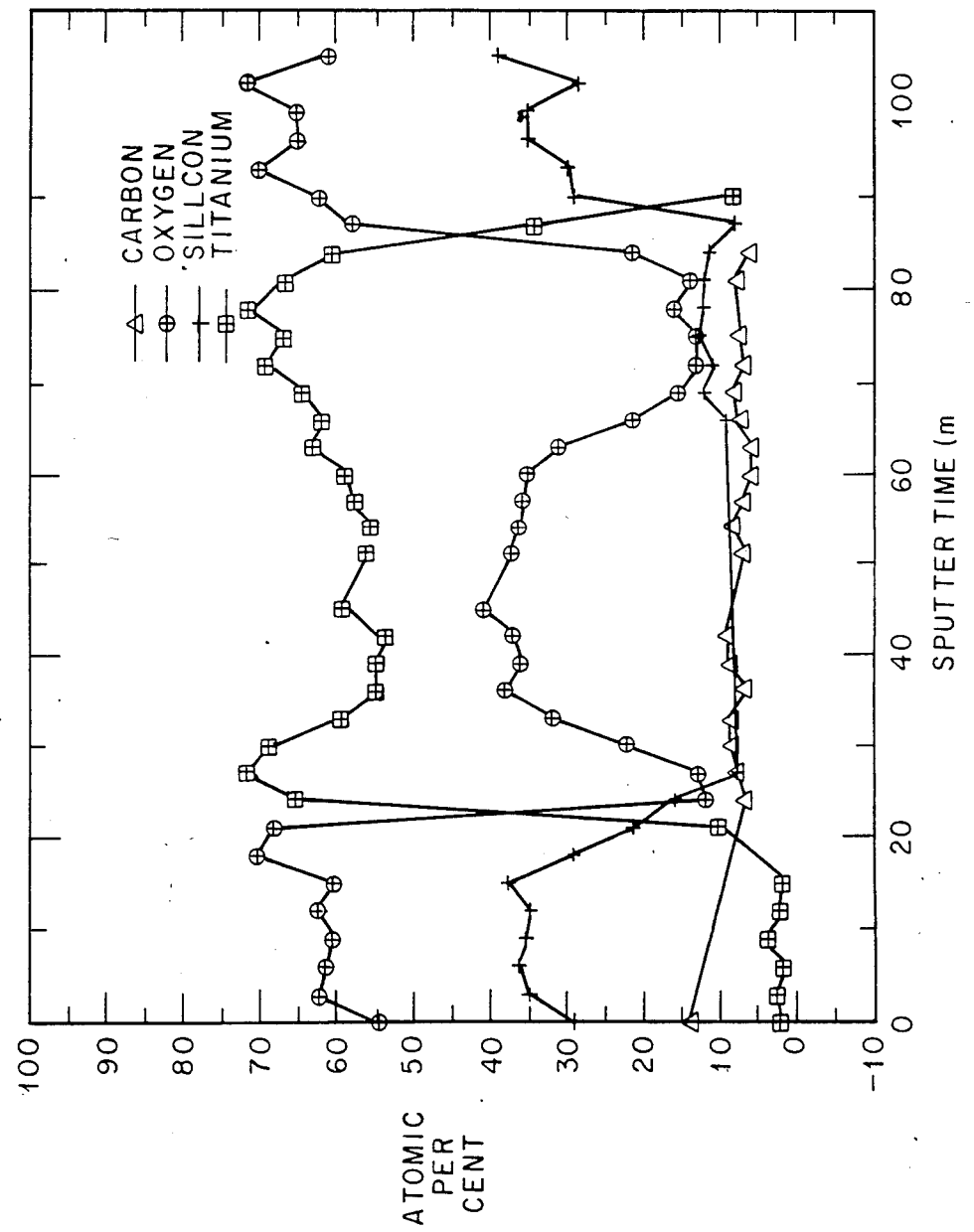
FIG. 1 shows an Auger composition profile of a structure where 1000 A of plasma oxide over 1000 A of Ti over 3000 A of thermal oxide over silicon has been reacted at 675 C. for 30 minutes in an atmosphere of Ar plus $N_2$, where the triangles represent datapoints for carbon, the circles represent datapoints for oxygen, the crosses represent datapoints for silicon, and the squares represent datapoints for titanium. Note that percentages shown as less than 5% may be considered to be lost in the noise level, and that the first two or three data points in time are likely to be dominated by contaminant and/or ambient species.
Figure 2:
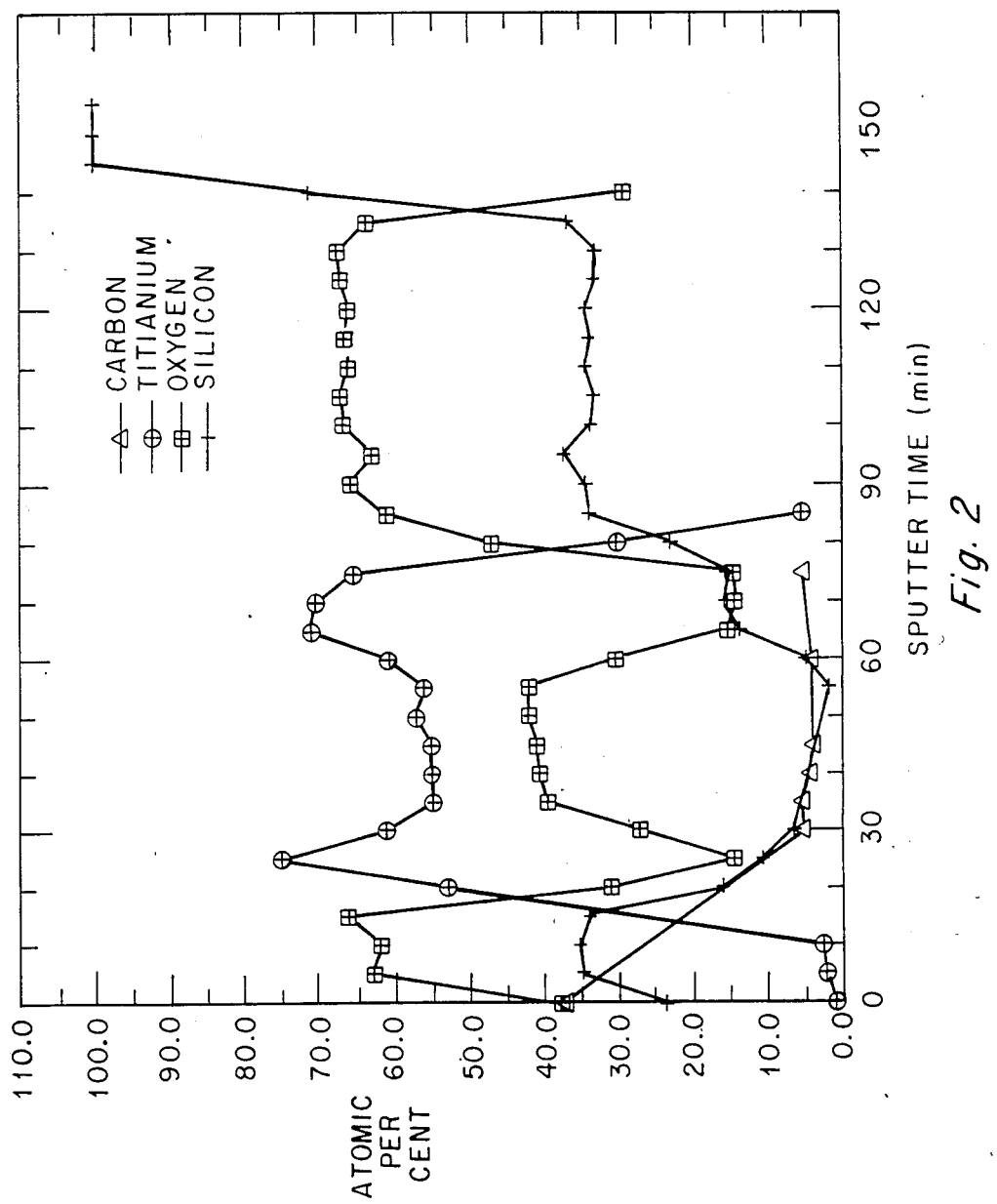
FIG. 2 shows an Auger composition profile of a structure where plasma oxide over titanium over CVD TEOS oxide over silicon has been reacted at 675 C. for 30 minutes in an atmosphere of Ar plus $N_2$, where the triangles represent datapoints for carbon, the circles represent datapoints for titanium, the crosses represent datapoints for silicon, and the squares represent datapoints for oxygen.
Figure 3:
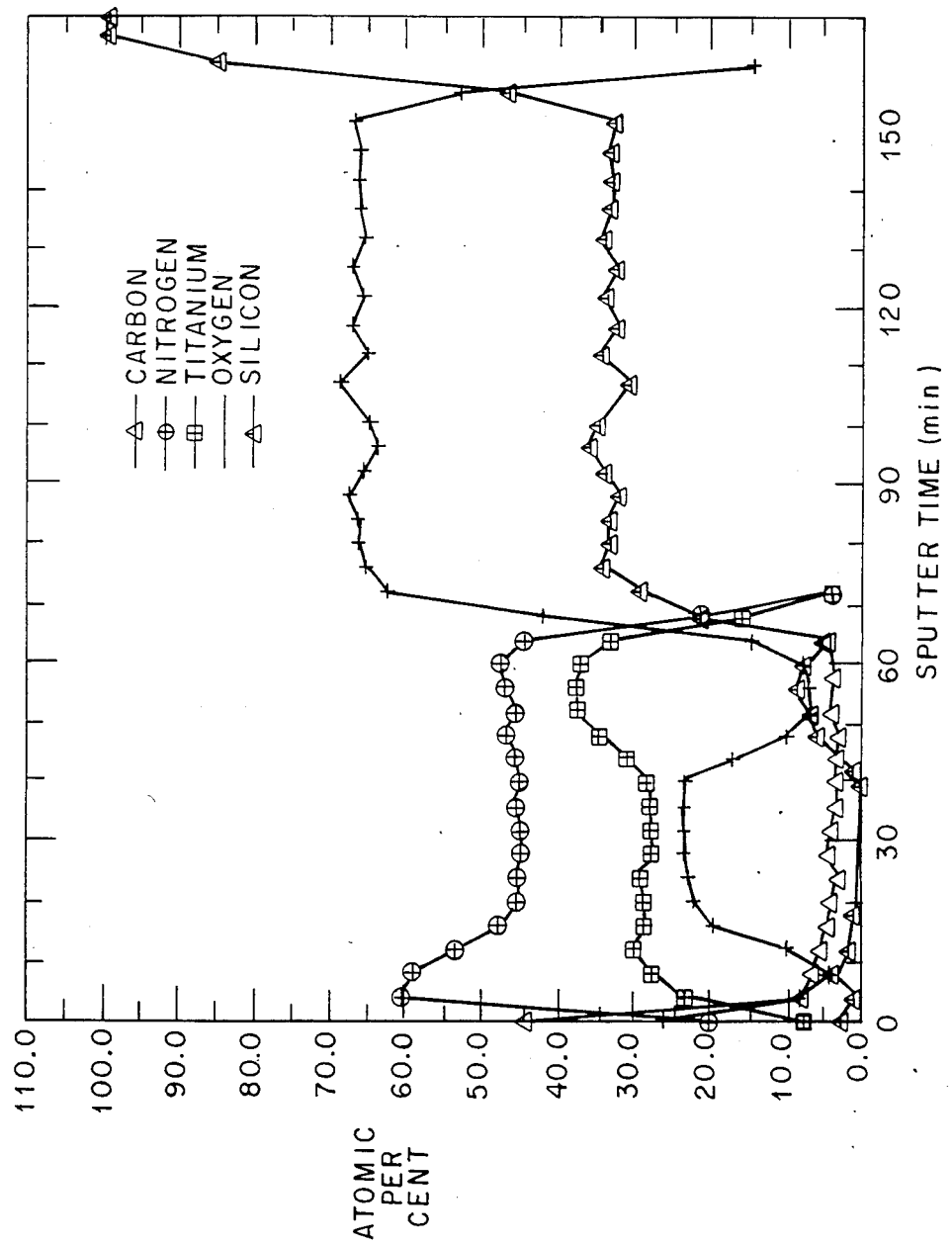
FIG. 3 shows an Auger composition profile of a structure where plasma oxide over titanium over CVD TEOS oxide has been reacted at 675 C., after which the plasma oxide is stripped and the remainder again reacted at 675 C. for 30 minutes in an atmosphere of Ar plus $N_2$, where the triangles represent datapoints for carbon, the circles represent datapoints for nitrogen, the crosses represent datapoints for oxygen, the squares represent datapoints for titanium, and the triangles with vertical lines inside them represent datapoints for silicon. (In this profile, the ratio of nitrogen to the other elements shown may not be precise, but the changes in the profiles with depth are accurately shown.)
Figure 4:
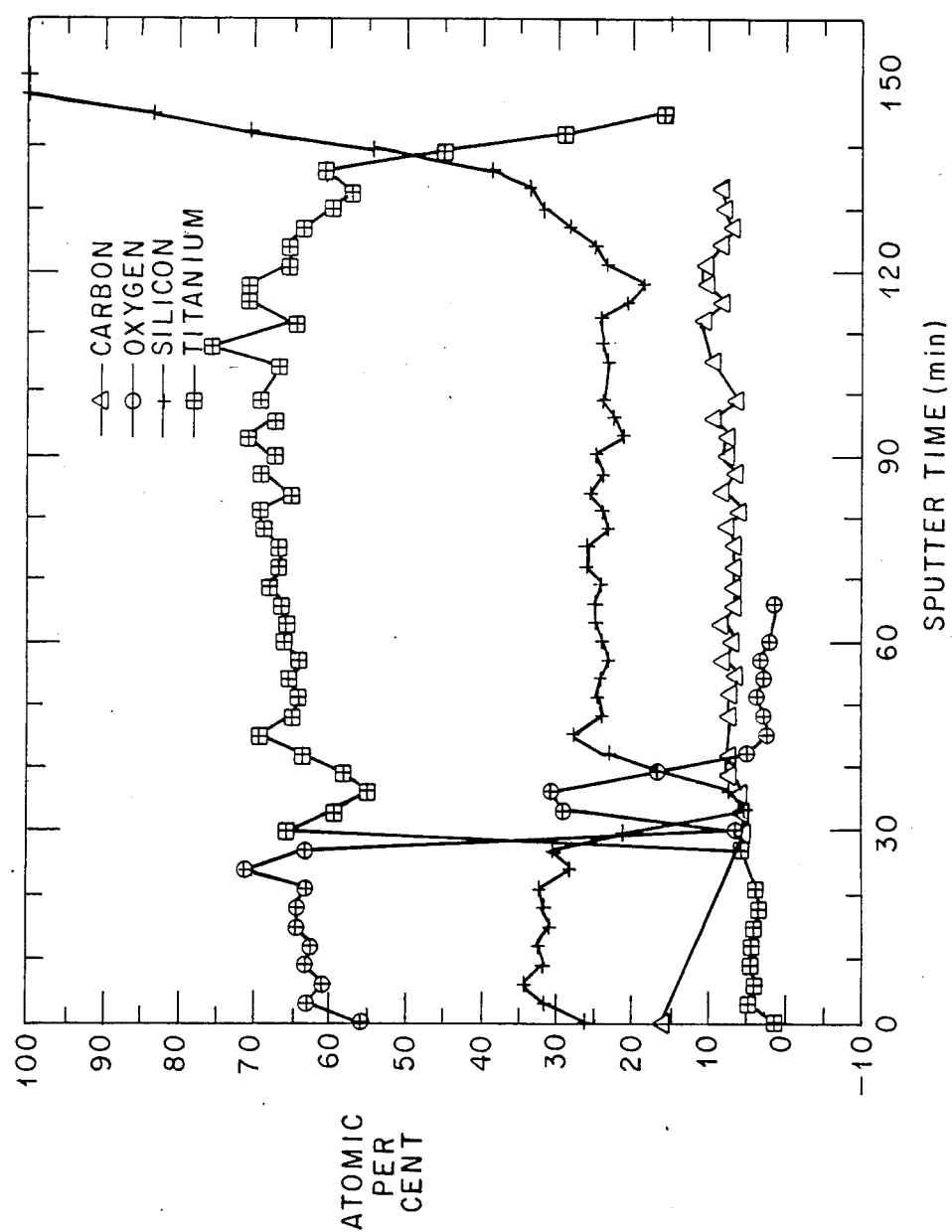
FIG. 4 shows an Auger composition profile of a structure where 1000 A of plasma oxide over 1000 A of Ti over p+ (boron implanted) silicon has been reacted at 675 C. for 30 minutes in an atmosphere of Ar plus $N_2$, where the triangles represent datapoints for carbon, the circles represent datapoints for oxygen, the crosses represent datapoints for silicon, and the squares represent datapoints for titanium.
Figure 5:
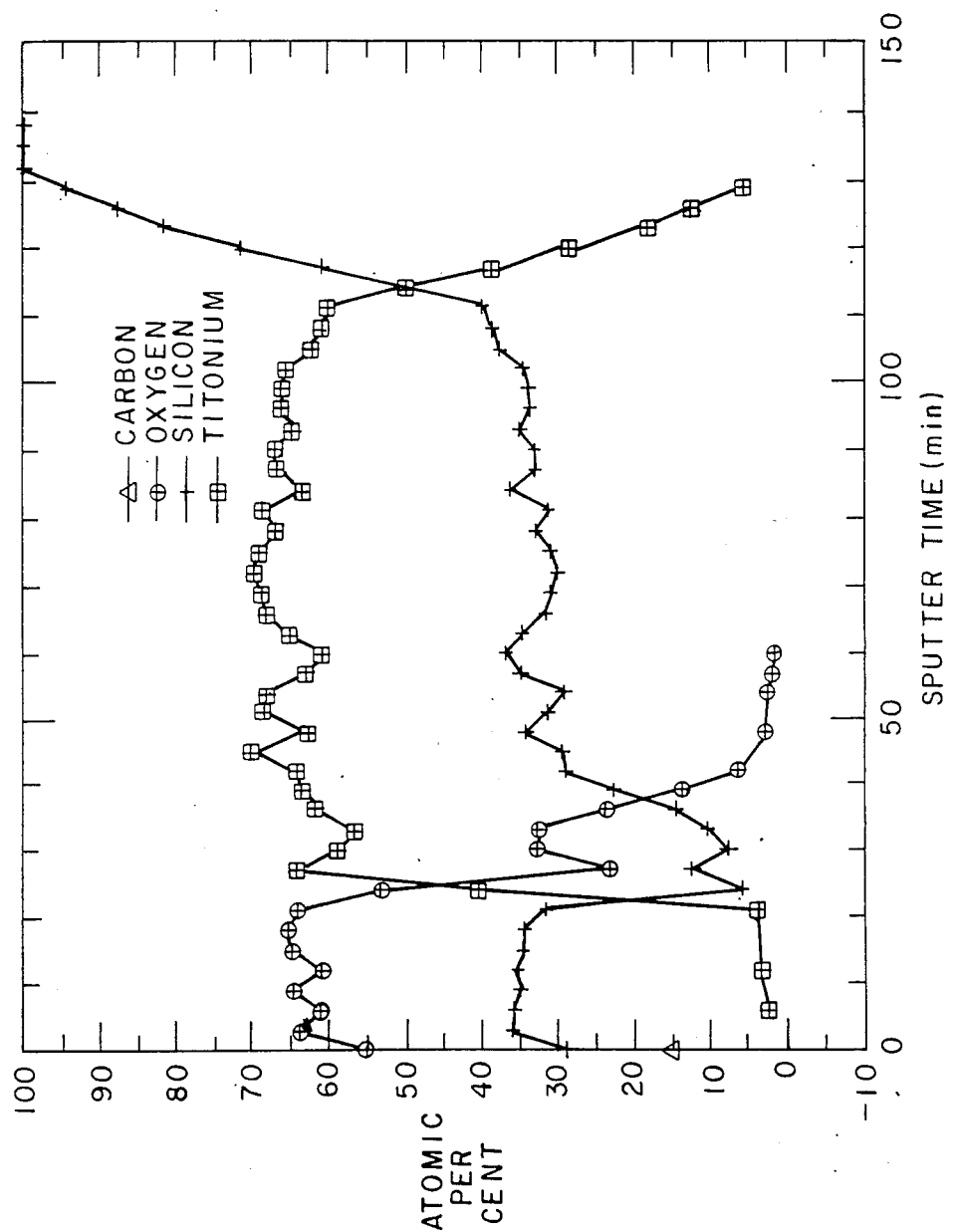
FIG. 5 shows an Auger composition profile of a structure where 1000 A of plasma oxide over 1000 A of Ti over 4500 A of n+ ($POCl_3$-doped) polysilicon has been reacted at 675 C. for 30 minutes in an atmosphere of Ar plus $N_2$, where the triangles represent datapoints for carbon, the circles represent datapoints for oxygen, the crosses represent datapoints for silicon, and the squares represent datapoints for titanium.
Figure 6B:
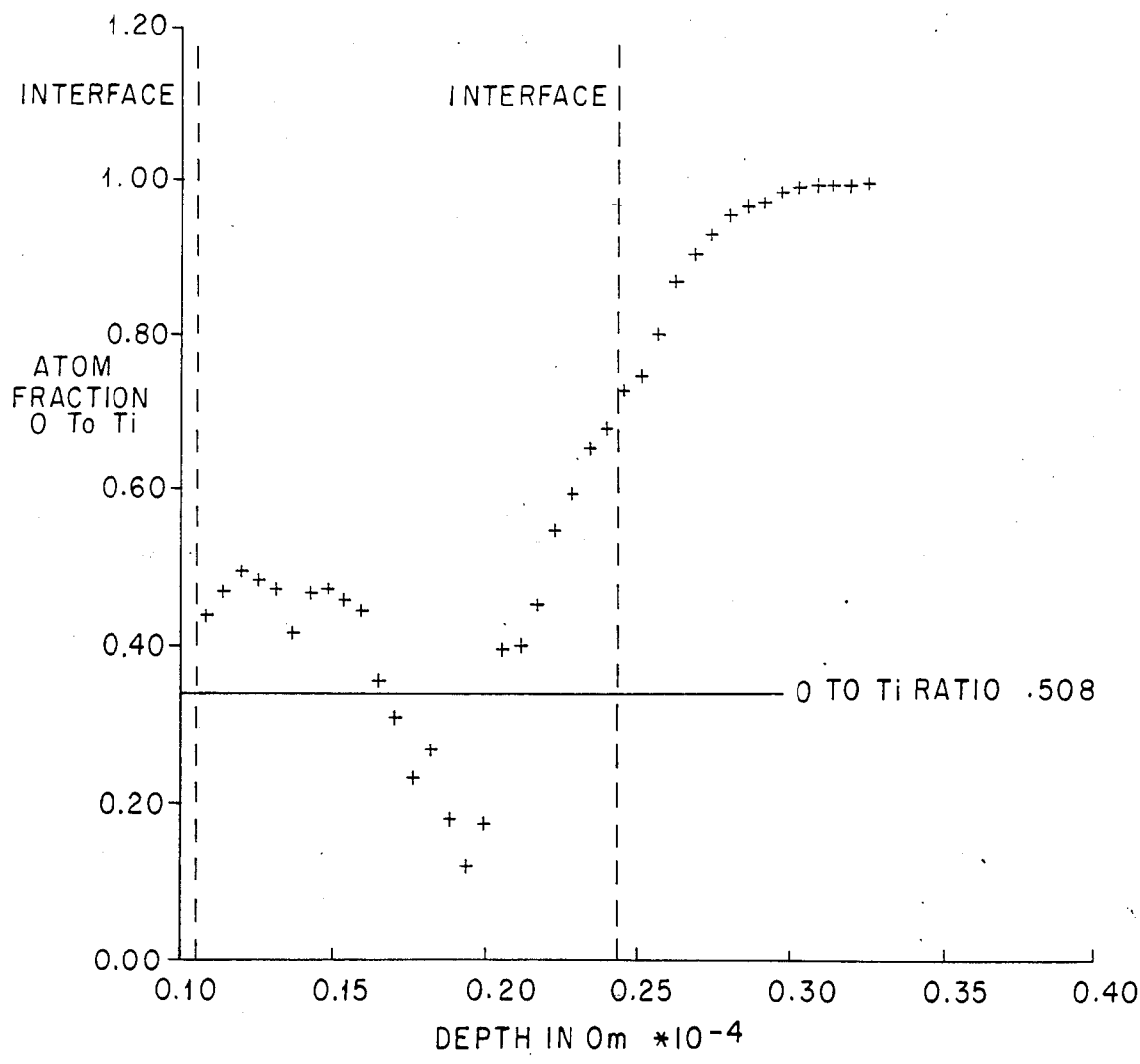
FIG. 6B shows a plot, derived from this raw data, showing the atomic ratio of O to Ti between the first interface (plasma oxide/Ti) and the second interface (Ti/thermal oxide). The exact depths shown are not precise, since they are calculated using assumptions about density which may be inaccurate, but the profile of relative concentration with depth is reliable.
Figure 7A:
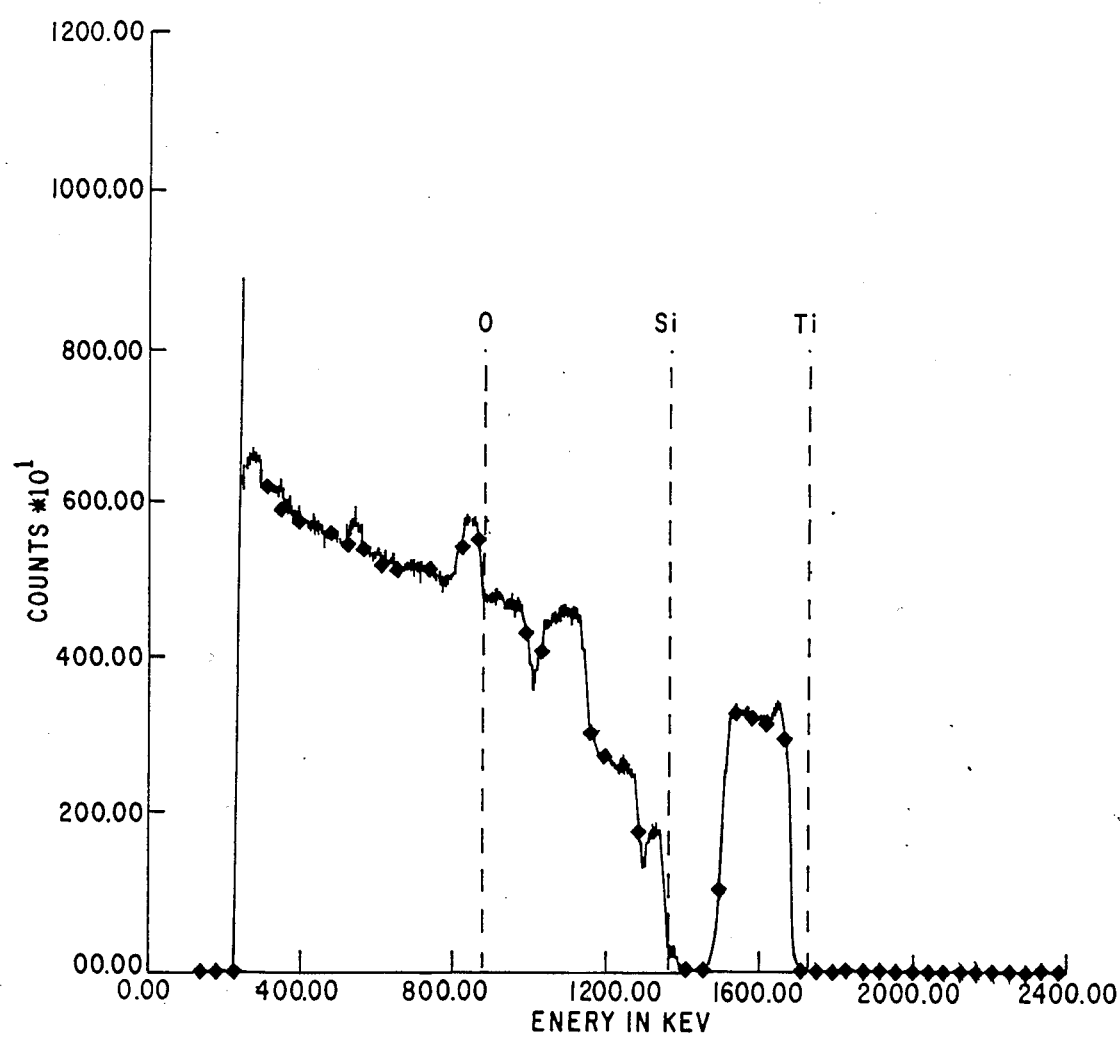
FIG. 7A shows the raw data of counts versus secondary ion energy derived from a Rutherford Backscattering analysis (RBS analysis) of a structure having 1000 A of plasma-deposited $SiO_2$ over about 2700 A of $TiSi_2$ over about a quarter micron of polysilicon over about 700 A of thermal $SiO_2$.
Figure 7B:
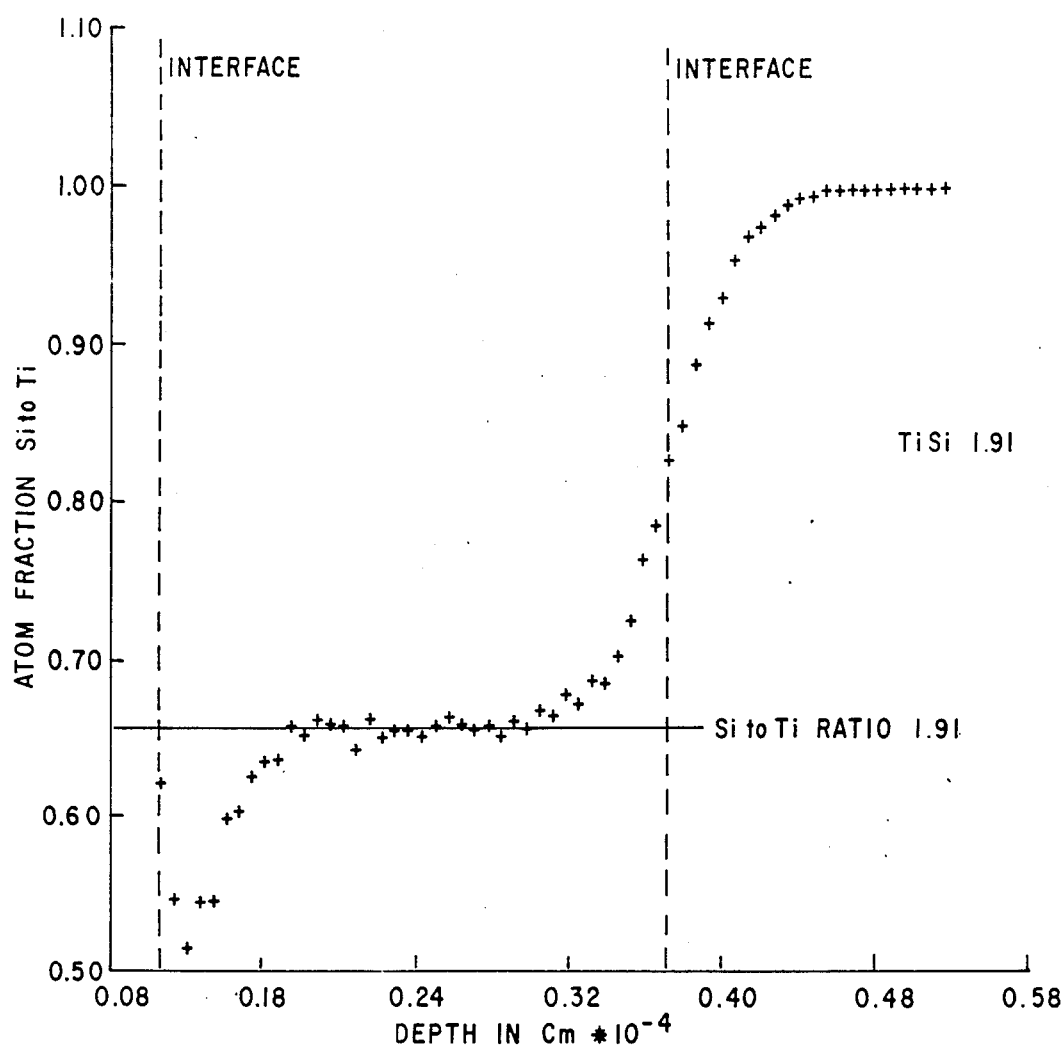
FIG. 7B shows the plot of Si:Ti ratio versus depth derived from this data.
Figure 8A:
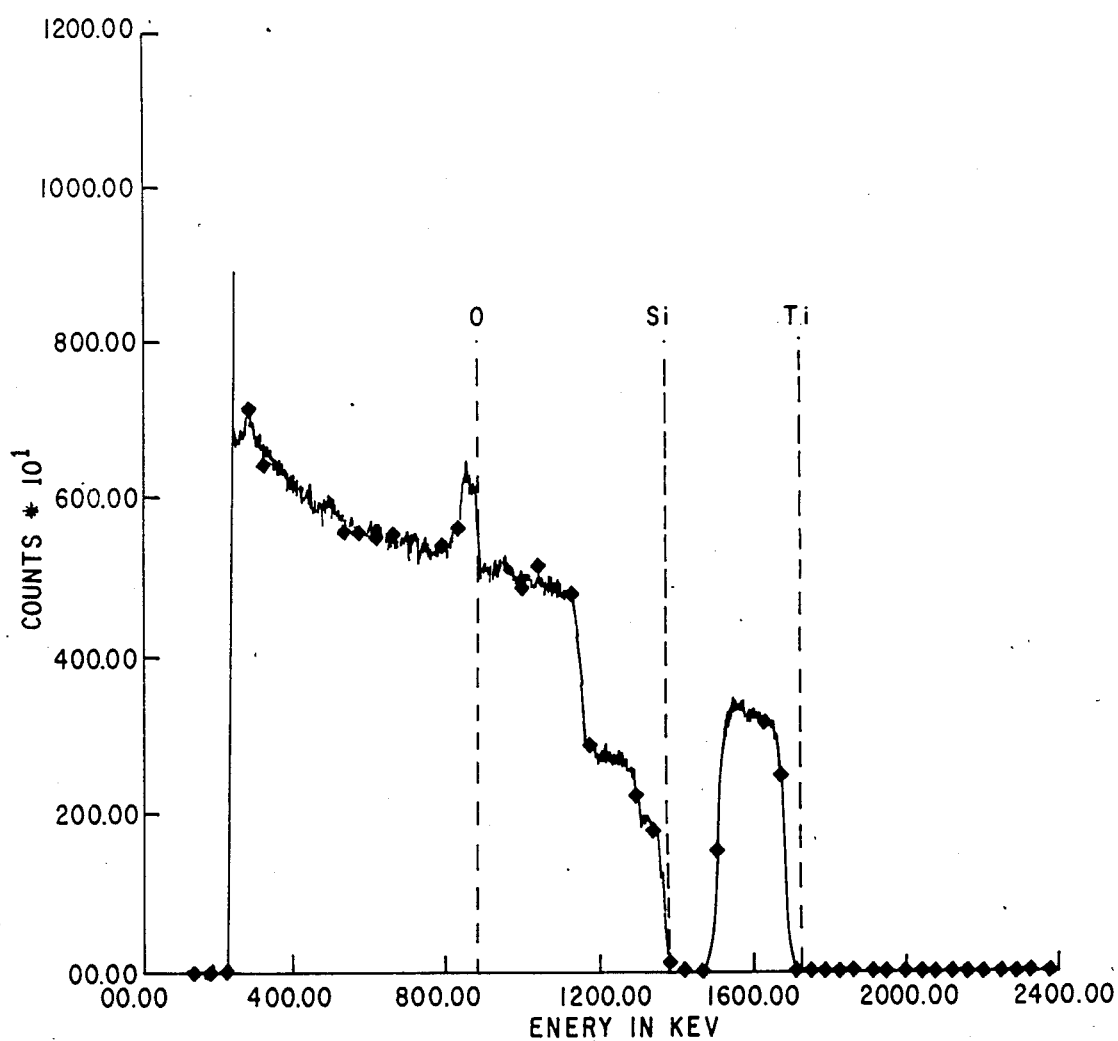
FIG. 8A shows the raw data of counts versus secondary ion energy derived from a Rutherford Backscattering analysis (RBS analysis) of a structure having 1000 A of plasma-deposited $SiO_2$ over about 2900 A of $TiSi_2$ over crystalline silicon.
Figure 8B:
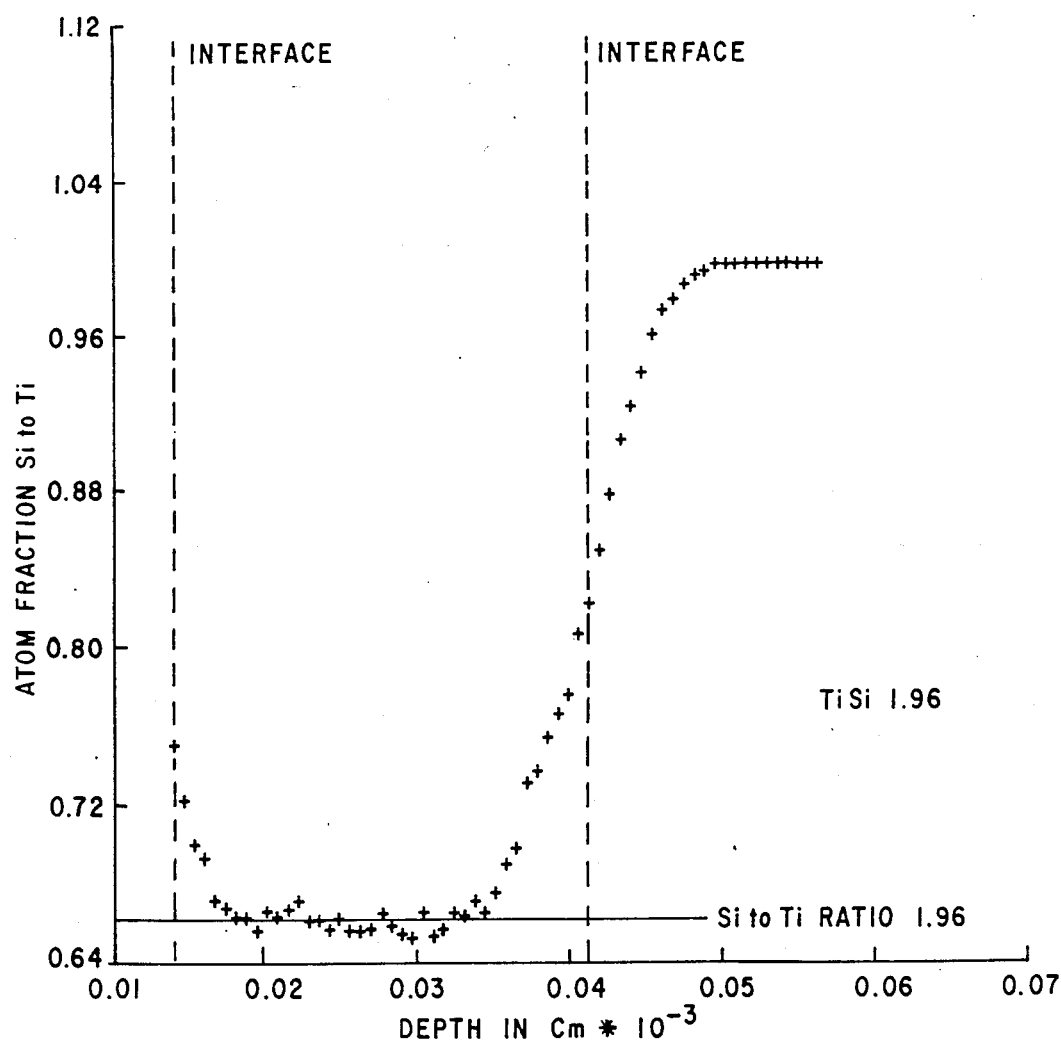
FIG. 8B shows the plot of Si:Ti ratio versus depth derived from this data.
Figure 9:
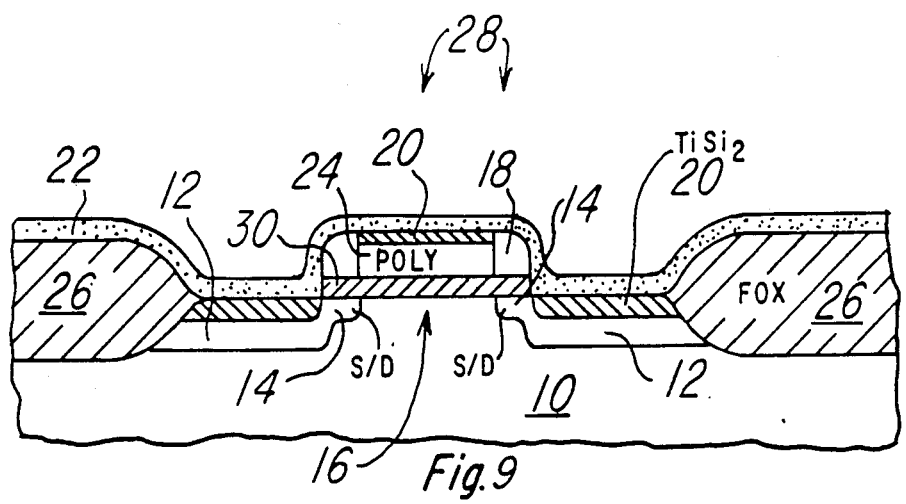
FIG. 9 shows a portion of a source/drain (moat) region after titanium has been deposited and reacted to form titanium silicide regions where silicon was exposed, and titanium nitride elsewhere.

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

The oxide capped version of the $TiSi_2$ process involves the deposition of an oxide layer, 500–1000 A thick, on top of the 1000 A thick Ti layer prior to the reaction process. The normal atmospheric 675 C. reaction process then takes place, but without concern of the reaction ambient being contaminated by $O_2$.

During the reaction process the oxide at the $Ti/SiO_2$ interface provides a source of oxygen atoms which diffuse into the Ti layer. At low temperatures (e.g. in the 600–675 C. range), the $O_2$ is gettered at the Ti grain boundaries which retards silicon atom outdiffusion. The presence of the oxide layer on top of the Ti makes the process insensitive to contaminates in the reaction gas ambient. This has been verified by processing some CMOS logic integrated circuits (1 micron minimum geometry) through the oxide capped $TiSi_2$ process in a purposely contaminated furnace.

A PSG-contaminated $TiSi_2$ reaction furnace was used for this experiment and the purified argon line was shut off. The $N_2$ flow from the source end of the tube was reduced from the standard 10 liters/min to 2 liters/min. The purge gas at the load end of the furnace was also shut off. The purge time, push and pull rates were all standard, and the reaction condition were set (in various runs) at reasonably standard levels, viz. 30 min at 625, 650, and 675 C.

Nine wafers of devices were processed, along with two Ti on oxide pilot slices (which are normally processed with each lot to monitor reaction ambient contamination. Four lot wafers had 1000 A of PECVD oxide (300 C.) deposited on the 1000 A of Ti, while the other five wafers had a combination of 800 A of PECVD oxide plus 400 A of plasma nitride.

After the reaction process the Ti over oxide pilot slice at the source end of the tube had turned to a dark blue/brown color over ⅔ of the slice area, indicating gross ambient contamination. The lot slices were then processed through a regular plasma oxide etch with 30% over etch using end point detection. After the dry etch the nine lot slices went through a Megasonic Ti/TiN strip process ($H_2O_2$/$NH_4OH$ solution, ultrasonic power at low duty cycle).

Probing of the normal bridging structures, that check for silicide shorts between moats and from gates to moats, indicated no bridging for either the p-channel or n-channel devices. The moat and gate sheet resistances were normal at about 1 $\Omega/\square$. Visual inspection showed no $TiSi_2$ outdiffusion, and the silicide quality looked normal.

Another test that used the oxide capped structure in conjunction with rapid thermal processing (RTP) silicide formation (700 C. for 15 sec) also showed normal results.

The cap oxide method has been demonstrated in the fabrication of MOSFET structures. Silicon outdiffusion to form TiSi$_2$ was not observed. Transistors with gate length in the submicron range and sidewall oxide of 3000 Å were successfully fabricated. The contaminated oxygen atom is expelled away after the final anneal, therefore, did not affect the film quality of the TiSi$_2$ layer. Sheet resistance of the TiSi$_2$ after anneal was the same as the traditional self-aligned TiSi$_2$ layer. The process flow of this invention is described in next section.

A sample process flow is as follows:
After S/D anneal, deposit pure titanium (1000 Å)
Deposit low temperature silicon nitride/silicon dioxide layer (400 Å/800 Å)
Silicide react (675 C., 30 min)
Plasma etch nitride/oxide layer
Selectively strip unreacted titanium (and nitride/oxide filaments) by wet chemical etch
Silicide anneal (800 C., 30 min)
Another sample process flow is as follows:
After S/D anneal, deposit 0.1 μm of pure titanium
Deposit low temperature (300 C.) SiO$_2$
Silicide reaction, 675 C. for 30 min in N$_2$
Unmasked plasma etch of oxide layer (using a standard fluoro-etch chemistry as commonly used for oxide/nitride etching)
Selective wet strip of Ti reaction products on oxide regions (H$_2$O$_2$/H$_2$SO$_4$, or H$_2$O$_2$/NH$_4$OH with ultrasonic agitation)
Silicide anneal
Another sample process flow is as follows:
After S/D anneal, deposit 0.1 μm of pure titanium
Deposit low temperature (300 C.) SiO$_2$
Silicide reaction, 700 C. for 15 sec (transient heating) in N$_2$
Unmasked plasma fluoro-etch of oxide layer
Selective wet strip of Ti reaction products on oxide regions (H$_2$O$_2$/H$_2$SO$_4$, or H$_2$O$_2$/NH$_4$OH with ultrasonic agitation)
Silicide anneal The cost of the process is an extra 0.1 μm plasma oxide deposition and an unmasked dry etch step. However, the benefit of eliminating the sensitivity of the process to ambient gas contamination, and therefore the improved reproducibility of the process, probably outweighs the disadvantage.

Figure 11:
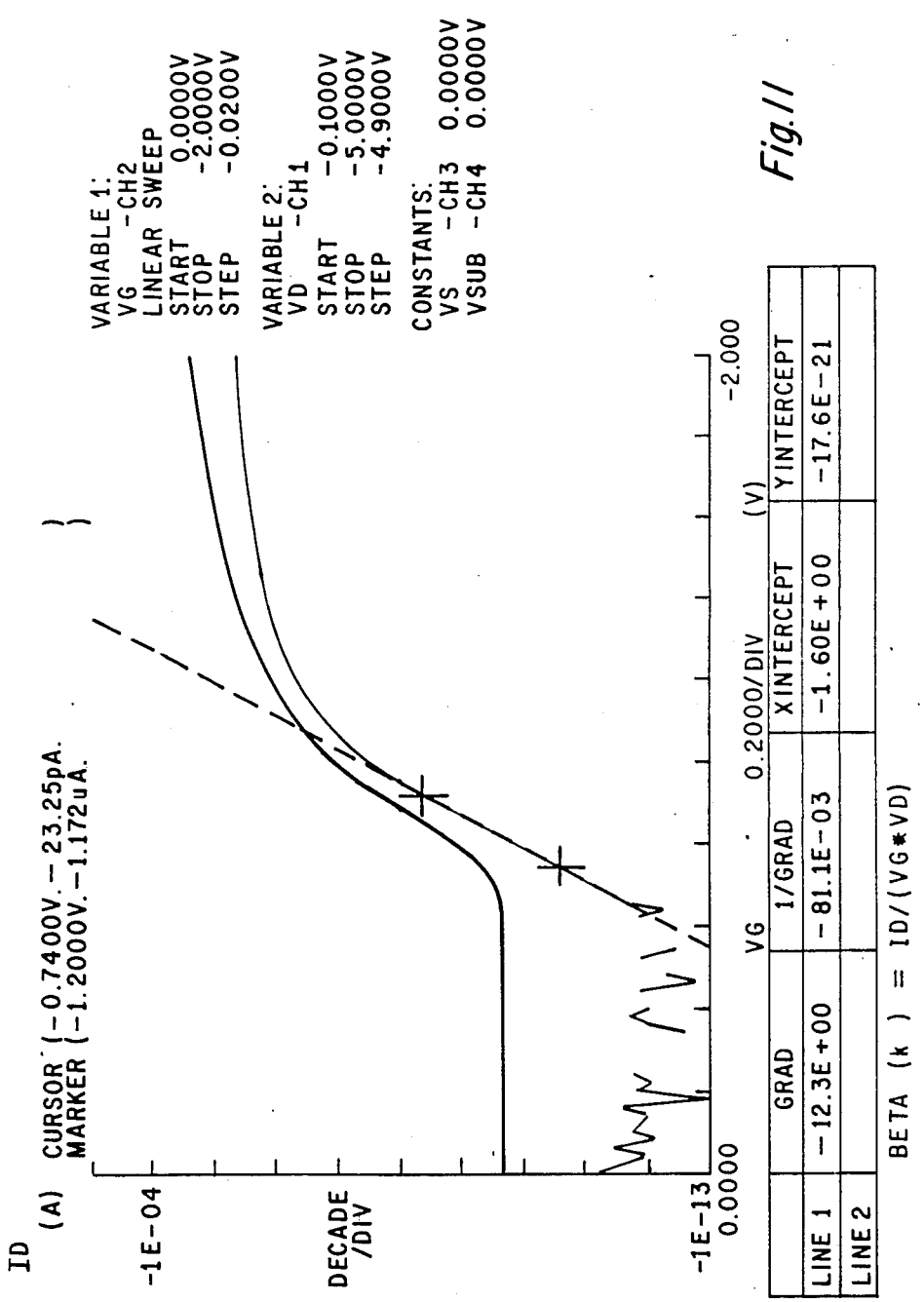
FIG. 11 shows transistor characteristics of an active device having $TiSi_2$-clad source/drain diffusion and gate formed according to the present invention. Note that subthreshold characteristics are quite adequate.

Some electrical measurements for device structures prepared by this procedure are shown in FIG. 11. It may be seen that the transistor structure tested there (which has source/drain cladding formed by the present invention) has acceptable subthreshold leakage.

To implement local interconnects with the present invention, there are at least three options:
The most preferable process flow is as follows:
apply Ti and cap oxide overall;
Do low-temperature Direct React;
pattern and etch cap oxide to leave cap oxide only over locations of local interconnect;
wet etch or dry etch using a chemistry which will remove titanium metal selectively over silicide, e.g. Megasonic cleanup (H$_2$O$_2$/NH$_4$OH/H$_2$O) or Piranha
strip cap oxide;
perform high-temperature react in nitrogen atmosphere to anneal silicides and form TiN local interconnects.

Another alternative is to pattern the local interconnects after the nitridation step, using a TiN etch. An advantage of this alternative is that the nitridation step may remove some of the oxygen from the Ti layer and make it easier to strip.

The third (and least preferred) alternative is as follows:
Apply Ti and cap oxide overall;
Do low-temperature Direct React;
strip cap oxide;
pattern photoresist to cover locations of local interconnect;
wet etch or dry etch using a chemistry which will remove titanium metal selectively over silicide;
strip photoresist;
perform high-temperature react in nitrogen atmosphere to anneal silicides and form TiN local interconnects.

Some test results actually achieved using the present invention are as follows:

| Sheet Resistance Before Annealing | Sheet Resistance After Annealing |
|---|---|
| USING RAPID THERMAL PROCESSING: | |
| Source/drain Diffusions: | |
| 1.07 ± .04 Ω/□ | 1.03 ± 0.278 Ω/□ |
| 1.12 ± 0.06 Ω/□ | 1.09 ± 0.0566 Ω/□ |
| Polysilicon Lines: | |
| 1.04 ± 0.05 Ω/□ | 1.02 ± 0.0197 Ω/□ |
| 1.02 ± 0.015 Ω/□ | 1.00 ± 0.00761 Ω/□ |
| USING FURNACE ANNEALING: | |
| Source/drain Diffusions: | |
| 1.31 ± 0.1 Ω/□ | 0.995 ± 0.0272 Ω/□ |
| 1.25 ± 0.12 Ω/□ | 0.985 ± 0.0251 Ω/□ |
| Polysilican Lines: | |
| 1.91 ± 0.2 Ω/□ | 0.902 ± 0.0196 Ω/□ |
| 1.86 ± 0.2 Ω/□ | 0.892 ± 0.224 Ω/□ |

Data were also taken on TiN local interconnect lines formed by patterning and etching the cap oxide, wet etching exposed metal, and then nitriding the remaining metal. The resistance measurements thus obtained showed (1) that the local interconnects thus formed have a sheet resistance of around 10 Ω/□, and (2) that the titanium is being undercut by about a half micron per side. Where this undercut is unacceptable, the unreacted metal could be stripped by a plasma etch instead.

Oxide-masked definition of local interconnects

As taught by the parent application, one way to get a patterned local interconnect layer is to deposit and pattern a thin hardmask *before* the step of reacting the titanium in a nitrogen atmosphere. For example, a 1000 Å layer of plasma oxide (i.e. silicon oxides deposited in a plasma reactor at low temperature, e.g. 300 C.—this produces a fairly low density oxide) can be deposited over the titanium metal, etched to mask local interconnects in the desired pattern (using an oxide etch such as CHF$_3$+C$_2$F$_6$+O$_2$+He, which is selective to titanium, so that the titanium layer under the plasma oxide provides an etch stop) and left in place during the reaction which produces TiN and TiSi$_2$ compounds. There will be significant reaction between the titanium metal and the plasma oxide, so that (in one example where rapid thermal annealing was used) Rutherford Backscattering Analysis has revealed that the titanium metal under the plasma oxide layer has an oxygen to titanium atomic ratio of 0.69:1 (as compared to an oxygen to titanium atomic ratio, for titanium which lies on field oxide and is exposed to the nitrogen atmosphere during the reaction step, of around 0.25:1). This high oxygen content is not enough to destroy the metallic conduction properties of the titanium, but does impart substantial resistance to etching ($TiO_2$ is an extremely stable compound which is very difficult to etch). The metallic titanium remaining can be converted to titanium nitrides and/or silicides by a subsequent reaction step. It has been experimentally found that this process does provide a local interconnect with valuable properties including conductivity, etch stop capability, and providing a barrier to lateral diffusion, although the interconnect thus provided is not initially pure TiN, at least where rapid thermal annealing is used for the silicidation (its atomic fraction of nitrogen is much less than 1%, except possibly at the corners of the plasma oxide mask). Note that the plasma oxide mask remains in place through the TiN etching step.

The additional fraction of oxygen introduced by this alternative embodiment can be highly advantageous in at least two ways. First, since $TiO_2$ is so chemically inert, it adds to the durability of the local interconnect layer as an etch stop at contact hole locations. Second, the etching of the TiN layer becomes simpler: a high fraction of oxygen in the layer under the hardmask makes it possible to wet etch the TiN without undercutting the hardmask patterned interconnects too much. A sample wet etch for this purpose would be $NH_3OH + H_2O_2$ in water at room temperature, but many other wet etch chemistries could be used.

That is, titanium silicide typically gives a rough surface, so it is a pleasant surprise that the titanium under the oxide mask reacts with the oxide mask to form titanium oxides as a surface sealant. This surface $TiO_2$-rich layer avoids in-migration of etchants during a wet etch and thus permits the simple wet etch process described.

In an alternative version of this embodiment, the plasma oxide hardmask is stripped after the silicidation heating step (the 675 C. step in the example given) and before the annealing step (the 800 C. step in the example given). By ensuring that a nitrogen atmosphere is present during the high-temperature step, any possibility of silicon and dopant outdiffusion is suppressed, and the remaining metallic titanium which the oxide mask protected from the first heating step will substantially all be converted to nitrides, providing additional diffusion barrier advantages as described above. Another (less preferred) alternative way (for NMOS processes or some CMOS processes with two types of polysilicon) to convert the patterned titanium into a stable conductor is to perform the high-temperature anneal in an atmosphere which does not include nitrogen, so that silicon outdiffusion can convert the titanium metal in the local interconnect straps to titanium silicide.

Note that the oxide hardmask does not strictly have to be stripped at all—optionally it can be left in place through the whole remainder of the process.

A very important advantage of this embodiment is that no TiN etch is required—instead the TiN is simply dipped out using a standard clean-up solution. Thus this embodiment may be the most suitable of all for transfer into a manufacturing environment.

Another advantage of this embodiment is that it is very scalable, since the geometry-limiting step is simply an oxide etch.

TiN Etch Conditions

One presently practiced etching process for the TiN layer uses a dry/wet etch combination, where the dry etch is a $CF_4$ (200 sccm) + He(50 sccm) etch in a single-slice reactor with 0.3 inch electrode spacing, 200 W power, 1 Torr pressure and with the substrate heated to 50 C. The wet etch is done in a Megasonic bath with a diluted solution of $H_2O_2$ and $NH_4OH$. The duty cycle of the Megasonic agitation was reduced from the standard Megasonic strip process. In the current dry/wet process, about 80% of the TiN is etched by the dry etch and the remainder is removed by the wet etch. The selectivity of the dry etch of TiN to $TiSi_2$ is close to 2.5:1. Therefore, about 200 A to 300 A of $TiSi_2$ (as is the 400 A or so so of TiN formed on top of the $TiSi_2$ during the nitrogen atmosphere reaction step) is etched away during the dry etch, which results in a 15 to 20% degradation in silicide sheet resistance. The Megasonic strip process has been modified (with diluted solution and reduced duty cycle) to reduce its attack on the photoresist. Experimental results show that the resist did not lift after 15 min in the wet etch. A 9 minute wet etch is used in the dry/wet TiN etch process. As the selectivity of the dry etch improves, the wet etch role will reduce to a filament etch.

A sample set of conditions for TiN etching is as follows:
1. Dry etch:
   70 C. substrate
   Reactants: $CF_4$ (200 sccm) + He (50 sccm)
   silicon electrode reactor
   0.3 inch electrode spacing
   200 W power
   1 Torr pressure
2. Wet etch:
   Dilute solution of $H_2O_2$ and $NH_4OH$
   with ultrasonic agitation
   for 9 minutes These conditions will give a residence time for the $CF_4$ (volumetrically calculated, i.e. ignoring dissociation) of 1 second. The silicon electrode has been found found to be distinctly more advantageous than an anodized aluminum electrode when using such a $CF_4$-based TiN etch process, presumably to provide a fluorine-deficient plasma. The following is a general listing of the etch rate results for the two electrodes:

|  | Si Electrode | Anodized Al Electrode |
| --- | --- | --- |
| TiN | 2250 A/min | 2600 A/min |
| $TiSi_2$ | 850 A/min | 1600 A/min |
| AZ-1400 (resist) | 5500 A/min | 8400 A/min |

The degradation in TiN:$TiSi_2$ and TiN:resist etch rate ratios observed with the anodized Al electrode points toward the importance of a fluorine-deficient plasma in achieving good selectivities between these materials. Some etch rates for this chemistry with other materials include: thermal oxide, 4750 A/min; AZ 1400, 5500 A/min; Kodak 820, 3300 A/min. The poor resist and oxide selectivities in these results prohibit doing dry etching only. However, increasing the slice substrate temperature from 50 to 70 degrees improves the resist selectivity by 25%.

That is, a "fluorine-deficient" plasma is one in which the ratio of fluorine atoms to other atoms (or at least to atom species derived from the source gas flow) is less in the plasma discharge volume than it is in the source gas flow. For example, in the $CF_4$ etch chemistry described, the ratio of fluorine atoms to carbon atoms in the source gas (where essentially all the carbon and all the fluorine is present as $CF_4$) is 4:1, but in the plasma (which includes $CF_4$ and also radical species such as free fluorine, $CF_2$, $CF_3$, etc.) the ratio is substantially smaller, e.g. 3.5 or less. (Note that the carbon atoms devolved from the substrate (e.g. volatiles outgassed from the photoresist) are not counted here.) Normally the etched surface itself will consume some fluorine to create a mild fluorine-deficiency; but one teaching of the present invention is that the fluorine-deficiency should be increased by increasing residence time and by using a fluorine sink in proximity to the glow discharge. The fluorine sink serves to preferentially remove fluorine from the plasma. For example, in the presently preferred embodiment, a silicon electrode serves as a fluorine sink, since it will be continually etched to form $SiF_4$. (Other materials having volatile fluorides, such as graphite, could also be used.)

Any fluorine discharge will etch TiN freely, but a simple fluorine discharge will also etch $TiSi_2$ rapidly; the problem is to etch TiN with some selectivity to $TiSi_2$.

It should also be noted that the use of fluorocarbons (as opposed to inorganic fluorine sources such as $SF_6$, $NF_3$, etc.) is itself particularly advantageous. When $CF_\chi$ radicals impinge on the TiN the carbon can go off as cyanogen radicals CN, which rapidly recombine to form volatile species such as $(CN)_2$, HCN, or FCN, but when the $CF_\chi$ radicals impinge on the silicide there is no such easy way to get rid of the carbon: the surface carbon from adsorbed species will therefore compete with the titanium atoms for reaction with impinging fluorine atoms, thus retarding the rate of formation of $TiF_4$ (and thus the rate of etching.) Thus, some fluorine centers (such as $BF_3$ or $SiF_4$) are unsuitable because they do not have a volatile nitride. Other fluorine sources (such as $SF_6$) are unsuitable because they are very copious fluorine sources; for example, $SF_6$ rapidly dissociates to form $SF_4$, and may then further dissociate to $SF_3$ radicals, etc. By contrast, $CF_4$ is a much milder (less copious) source of fluorine. To achieve fluorine deficiency, it is preferable to use a mild (not copious) fluorine source.

Moreover, the use of low gas flow rates increases the fluorine-deficiency of the plasma, but also increases the rate of polymer deposition. To keep polymer deposition from getting out of hand, the preferred embodiment uses elevated substrate temperatures (e.g. 70 C.). At 70 C. under the conditions given, an improved $TiN:TiSi_2$ selectivity can be achieved. The flow rate is preferably such as to replace the equivalent volume of the glow discharge 2 times per second or less. Higher substrate temperatures are also advantageous because they increase the volatility of the $TiF_4$ etch product, which tends to increase the etching throughput and also tends to give more selectivity to photoresist.

Thus, some of the important features of this TiN etching method include: a mild fluorine source, such as $CF_4$, is preferably used; a reducing electrode, such as silicon or graphite, is preferably used to scavenge fluorine; a relatively low flow rate is preferably used, to increase the fluorine deficiency of the plasma and thus increase the $TiN:TiSi_2$ etching selectivity; and the substrate temperature is preferably allowed to rise into the range between 60 and 100 C. during etching.

It should also be noted that, if processing conditions are varied, the TiN layer may have a higher oxygen content and therefore may be difficult to remove with the wet etch given. In such embodiments it may be more preferable to use a dry etch chemistry of the type described as a blanket etch to strip the TiN layer, using higher pressure if needed to provide isotropy.

A sample process flow for patterning the local interconnects according to one embodiment of the present invention is as follows:
1. Pattern TiN local interconnects: use 1400-27 or 1400-31 resist.
2. Hardbake the resist to 120 C.
3. Plasma etch the TiN:
   Gas: $CF_4$ (200 sccm)+He (50 sccm)
   Pressure: 1 Torr
   Time: 25 sec (90% of 1000 A TiN layer etched; i.e. the TiN etch rate is about 36 A/sec)
   Power: 200 W
   Substrate temperature: 50 C.
4. Ti strip in Megasonic (i.e. an ultrasonically-driven wet etching bath)
   Solution: $NH_4OH$ (3000 cc)+$H_2O_2$ (1750 cc)+$H_2O$ (24000 cc)
   Time: 9 min
   Power: 250 W
   Duty cycle: 10% to 20% with 60 sec period
5. Ash the resist: 60 min
6. Solvent resist strip: R-10, 50 C., 10 min
7. Cleanup
   Solution: HCl (37–38% concentration): $H_2O$ = 1:1
   Time: 20 min
8. $TiSi_2$/TiN anneal: 30 min, atmosphere including $N_2$ (e.g. forming gas), at 800 C.
9. deposit MLO, e.g. 5000 A of PSG
10. Pattern and etch contacts
11. Deglaze:
    Solution: 1% (volumetric) buffered HF; buffered HF solution is a mixture of $HF:NH_4F:H_2O=49:11$ by weight.
    Time: 60 sec.
12. Remaining conventional steps, e.g. deposit and pattern metal, vias and second metal (if used), protective overcoat, etc.

Figure 10:
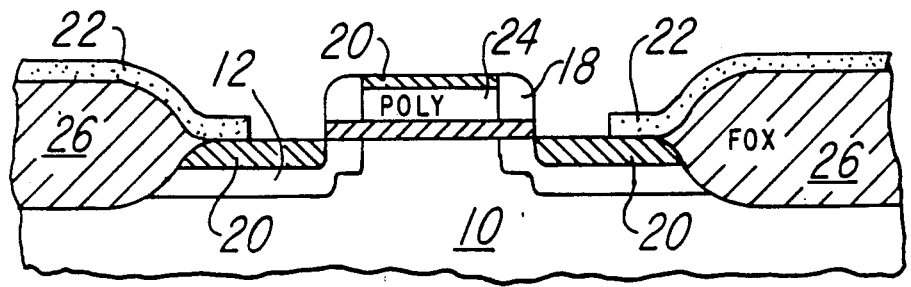
FIG. 10 shows a subsequent stage in the present invention, wherein the titanium nitride layer has been patterned to provide local interconnects and contact pads as desired.

After the TiN layer 22 has been patterned as desired, to produce the structure of FIG. 10, a second annealing step is preferably used to lower the sheet resistance of the silicide layers 20 to one ohm per square or less. This second heat treatment step is preferably performed at 800 degrees C. for 30 minutes in an argon atmosphere at atmospheric pressure, but these parameters may be varied. For example, the annealing temperature could be in the range of 750 degrees to 875 degrees, or even wider, and the other processing parameters of this step can also be widely varied.

In fact, the silicidation may optionally be performed as a transient heating step, using a flash lamp or laser heating or other transient heating methods. This tends to leave a higher atomic fraction of unreacted titanium in the titanium nitride layers, which as noted may facilitate patterning, and may be disposed of in the later anneal.

After the final anneal which lowers the sheet resistance of the silicide has been performed, processing then proceeds in conventional fashion. For example, an interlevel dielectric could now be deposited, such as 1000 A of low pressure CVD pad oxide followed by a micron of borophosphosilicate glass. Contact holes would then be cut in the interlevel dielectric and a patterned metal layer formed to achieve a desired pattern of electrical interconnections.

The only modification to subsequent processing which is preferably used is that the contact etch which cuts through the interlevel dielectric is preferably an etch chemistry which will stop on titanium nitride. This means that the titanium nitride layer 22 can be used as a diffusion barrier at the bottom of contacts, and also that the contacts to moat can be allowed to overlap onto the field oxide regions 26, since the titanium nitride 22 will prevent undercutting of exposed portions of field oxide 26 during the contact etch. Normal fluorine-based oxide etch chemistries, such as $CF_4$ plus 5% $O_2$, are reasonably selective to TiN.

Of course the polysilicon gate layer so frequently referred to in the present application does not have to be strictly polysilicon, but can be other materials which are substantially polycrystalline or amorphous and contain a large fraction of silicon; in this usage silicides and polysilicon/silicide sandwich structures are certainly comprehended, and future sandwich structures which have analogous deposition and electrical properties in future processes to the place of polysilicon in present processes are intended to be comprehended also.

Similarly, the dielectric layer so frequently referred to as the cap oxide does not have to be pure silicon dioxide, nor even strictly silicon oxides, but may instead include a layered dielectric structure, as shown by various of the embodiments described, as long as an oxide layer having a heat of formation substantially less than that of $TiO_2$ is the lowest layer of the dielectric. This oxide layer is preferably a silicon oxide layer, but the teachings of the present invention may be adapted to other compounds as well. Less preferably, other dielectrics which will react with titanium to release an oxidizing species which is capable of passivating grain boundaries against diffusion may be used instead of silicon oxides.

Similarly, where the dielectric layer so frequently referred to as the cap oxide is itself covered with one or more additional layers to provide a diffusion barrier against oxygen, those layers do not have to be strictly silicon nitride, as in the most preferred embodiment, but could instead be of any other material (such as TiN) which will serve the same purpose.

Similarly, the metal layer so frequently referred to as titanium does not have to be strictly pure titanium, but may instead be any one of a wide range of titanium alloys or pseudo alloys, as long as their chemistry is dominated by titanium: Ti:V and Ti:Al alloys are certainly included here, and other intermetallic compositions such as Ti:Y or Ti:W may also be usable.

It is possible that the teachings of the present invention can be extended to metals other than titanium. In general, any metal which
1. forms a conductive silicide,
2. will not allow silicon diffusion (at temperatures suitable for silicide formation) if the metal is passivated with oxygen, and
3. can reduce silicon oxides (at temperatures suitable for silicide formation), is a candidate for use of the present invention. Although titanium is the only metal so far known to meet these requirements, and the present invention does give tremendous advantages when used with titanium (or titanium alloys), the teachings of the present invention could be applied to other suitable metals.

As will be appreciated by those skilled in the art, the present invention can be widely modified and varied, and its scope is not limited except as specified in the allowed claims.

What is claimed is:

1. A method for fabricating integrated circuit devices, comprising the steps of:
   (a) providing a substrate
      having thereon a partially fabricated integrated circuit structure
         including exposed portions consisting essentially of silicon;
   (b) depositing overall a metal layer consisting predominantly of titanium;
   (c) providing a dielectric layer directly overlying at least predetermined portions of said metal layer, said dielectric layer consisting predominantly of oxides; and
   (d) applying heat until portions of said metal layer react with portions of said exposed silicon to form titanium silicides;
      whereby said dielectric layer suppresses silicon outdiffusion through portions of said metal layer under said dielectric layer.

2. The method of claim 1 further comprising the additional steps, subsequent to said step (d), of
   (e) removing predetermined portions of said dielectric layer and/or of the remainder of said metal layer in a predetermined pattern to define local interconnects; and
   (f) applying heat in a nitrogen atmosphere to convert remaining portions of metal layer to a conductive material consisting predominantly of titanium nitride.

3. The method of claim 1 further comprising the additional steps, subsequent of step (d), of
   (e) removing said dielectric layer;
   (f) applying heat in a nitrogen atmosphere to convert remaining portions of metal layer to a conductive material consisting predominantly of titanium nitride; and
   (g) etching said conductive material in a predetermined pattern to provide local interconnect lines.

4. The method of claim 1 further comprising the additional steps, subsequent to said step (d), of
   (e) removing said dielectric layer;
   (f) etching remaining portions of said metal layer in a predetermined pattern corresponding to locations of local interconnect lines; and
   (g) applying heat in a nitrogen atmosphere to convert remaining portions of said metal layer to a conductive material consisting predominantly of titanium nitride.

5. A method for fabricating integrated circuit devices, comprising the steps of:
   (a) providing a substrate
      having thereon a partially fabricated integrated circuit structure
         including exposed portions consisting essentially of silicon;
   (b) depositing overall a metal layer, said metal
      (1) being capable of forming a conductive silicide by thermal reaction.
      (2) not allowing silicon diffusion through said metal (at temperatures suitable for said silicide formation) if said metal is passivated with oxygen, and
- (3) being capable of reducing $SiO_2$ (at temperatures suitable for said silicide formation);
(c) providing a dielectric layer directly overlying at least predetermined portions of said metal layer, said dielectric layer consisting predominantly of oxides; and
(d) applying heat until portions of said metal layer react with portions of said exposed silicon to form titanium silicides;
whereby said dielectric layer suppresses silicon outdiffusion through portions of said metal layer under said dielectric layer.

6. The method of claim 1 wherein said metal layer comprises more than 50% atomic of titanium.

7. The method of claim 1 wherein said metal layer consists essentially of titanium.

8. The method of claim 1 wherein said metal layer is deposited to a thickness less than 2000 A.

9. The method of claim 1 wherein said dielectric layer consists essentially of silicon oxides.

10. The method of claim 1 wherein said dielectric layer is formed as a layered structure, and the portion of said dielectric layer closest to said metal layer consists essentially of silicon oxides.

11. The method of claim 1 wherein said dielectric layer is formed as a layered structure, and the portion of said dielectric layer closest to said metal layer consists essentially of an oxide having a heat of formation substantially less than that of $TiO_2$.

12. The method of claim 1 wherein said dielectric layer consists essentially of a low-density silicon oxide.

13. The method of claim 1, wherein said dielectric layer consists essentially of a low-density silicon oxide including a large fraction of hydrogen.

14. The method of claim 1 wherein said dielectric layer is formed as a layered structure, and the portion of said dielectric layer closest to said metal layer consists predominantly of silicon oxides, and at least one other portion of said layered structure consists essentially of silicon nitride.

15. The method of claim 1 wherein said dielectric layer is formed as a layered structure, and the portion of said dielectric layer closest to said metal layer consists predominantly of silicon oxides, and at least one other portion of said layered structure consists essentially of a material which will provide a diffusion barrier to oxygen.

16. The method of claim 2 wherein said metal layer comprises more than 50% atomic of titanium.

17. The method of claim 2 wherein said metal layer consists essentially of titanium.

18. The method of claim 2 wherein said metal layer is deposited to a thickness less than 2000 A.

19. The method of claim 2 wherein said dielectric layer consists essentially of silicon oxides.

20. The method of claim 2 wherein said dielectric layer is formed as a layered structure, and the portion of said dielectric layer closest to said metal layer consists essentially of silicon oxides.

21. The method of claim 2 wherein said dielectric layer is formed as a layered structure, and the portion of said dielectric layer closest to said metal layer consists essentially of an oxide having a heat of formation substantially less than that of $TiO_2$.

22. The method of claim 2 wherein said dielectric layer consists essentially of a low-density silicon oxide.

23. The method of claim 2 wherein said dielectric layer consists essentially of a low-density silicon oxide including a large fraction of hydrogen.

24. The method of claim 2 wherein said dielectric layer is formed as a layered structure, and the portion of said dielectric layer closest to said metal layer consists predominantly of silicon oxides, and at least one other portion of said layered structure consists essentially of silicon nitride.

25. The method of claim 2 wherein said dielectric layer is formed as a layered structure, and the portion of said dielectric layer closest to said metal layer consists predominantly of silicon oxides, and at least one other portion of said layered structure consists essentially of a material which will provide a diffusion barrier to oxygen.

26. The method of claim 3 wherein said metal layer comprises more than 50% atomic of titanium.

27. The method of claim 3 wherein said metal layer consists essentially of titanium.

28. The method of claim 3, wherein said metal layer is deposited to a thickness less than 2000 A.

29. The method of claim 3, wherein said dielectric layer consists essentially of silicon oxides.

30. The method of claim 3 wherein said dielectric layer is formed as a layered structure, and the portion of said dielectric layer closest to said metal layer consists essentially of silicon oxides.

31. The method of claim 3 wherein said dielectric layer is formed as a layered structure, and the portion of said dielectric layer closest to said metal layer consists essentially of an oxide having a heat of formation substantially less than that of $TiO_2$.

32. The method of claim 3 wherein said dielectric layer consists essentially of a low-density silicon oxide.

33. The method of claim 3 wherein said dielectric layer consists essentially of a low-density silicon oxide including a large fraction of hydrogen.

34. The method of claim 3 wherein said dielectric layer is formed as a layered structure, and the portion of said dielectric layer closest to said metal layer consists predominantly of silicon oxides, and at least one other portion of said layered structure consists essentially of silicon nitride.

35. The method of claim 3 wherein said dielectric layer is formed as a layered structure, and the portion of said dielectric layer closest to said metal layer consists predominantly of silicon oxides, and at least one other portion of said layered structure consists essentially of a material which will provide a diffusion barrier to oxygen.

36. The method of claim 4 wherein said metal layer comprises more than 50% atomic of titanium.

37. The method of claim 4 wherein said metal layer consists essentially of titanium.

38. The method of claim 4 wherein said metal layer is deposited to a thickness less than 2000 A.

39. The method of claim 4 wherein said dielectric layer consists essentially of silicon oxides.

40. The method of claim 4 wherein said dielectric layer is formed as a layered structure, and the portion of said dielectric layer closest to said metal layer consists essentially of silicon oxides.

41. The method of claim 4 wherein said dielectric layer is formed as a layered structure, and the portion of said dielectric layer closest to said metal layer consists essentially of an oxide having a heat of formation substantially less than that of $TiO_2$.

42. The method of claim 4 wherein said dielectric layer consists essentially of a low-density silicon oxide.

43. The method of claim 4 wherein said dielectric layer consists essentially of a low-density silicon oxide including a large fraction of hydrogen.

44. The method of claim 4 wherein said dielectric layer is formed as a layered structure and the portion of said dielectric layer closest to said metal layer consists predominantly of silicon oxides, and at least one other portion of said layered structure consists essentially of silicon nitride.

45. The method of claim 4 wherein said dielectric layer is formed as a layered structure, and the portion of said dielectric layer closest to said metal layer consists predominantly of silicon oxides, and at least one other portion of said layered structure consists essentially of a material which will provide a diffusion barrier to oxygen.

46. The method of claim 5 wherein said metal layer comprises more than 50% atomic of titanium.

47. The method of claim 5 wherein said metal layer consists essentially of titanium.

48. The method of claim 5 wherein said metal layer is deposited to a thickness less than 2000 A.

49. The method of claim 5 wherein said dielectric layer consists essentially of silicon oxides.

50. The method of claim 5 wherein said dielectric layer is formed as a layered structure, and the portion of said dielectric layer closest to said metal layer consists essentially of silicon oxides.

51. The method of claim 5 wherein said dielectric layer is formed as a layered structure, and the portion of said dielectric layer closest to said metal layer consists essentially of an oxide having a heat of formation substantially less than that of $TiO_2$.

52. The method of claim 5 wherein said dielectric layer consists essentially of a low-density silicon oxide.

53. The method of claim 5 wherein said dielectric layer consists essentially of a low-density silicon oxide including a large fraction of hydrogen.

54. The method of claim 5 wherein said dielectric layer is formed as a layered structure, and the portion of said dielectric layer closest to said metal layer consists predominantly of silicon oxides, and at least one other portion of said layered structure consists essentially of slicon nitride.

55. The method of claim 5 wherein said dielectric layer is formed as a layered structure, and the portion of said dielectric layer closest to said metal layer consists predominantly of silicon oxides, and at least one other portion of said layered structure consists essentially of a material which will provide a diffusion barrier to oxygen.

* * * * *